United States Patent [19]
Bae

[11] Patent Number: 5,712,633
[45] Date of Patent: Jan. 27, 1998

[54] CONVERSION CHARACTERISTIC TEST CIRCUIT FOR ANALOG/DIGITAL CONVERTER AND METHOD THEREOF

[75] Inventor: Jeong Hwan Bae, Kyungki-do, Rep. of Korea

[73] Assignee: LG Semicon Co., Ltd., Cheong-ju, Rep. of Korea

[21] Appl. No.: 582,265

[22] Filed: Jan. 3, 1996

[30] Foreign Application Priority Data

Oct. 13, 1995 [KR] Rep. of Korea .................. 35384

[51] Int. Cl.[6] .................................................. H03M 1/12
[52] U.S. Cl. ........................ 341/120; 341/155; 324/73.1
[58] Field of Search .............................. 341/120, 155, 341/163, 164; 324/73.1

[56] References Cited

U.S. PATENT DOCUMENTS

| 5,132,685 | 7/1992 | DeWitt et al. | 341/120 |
| 5,185,607 | 2/1993 | Lyon et al. | 341/120 |
| 5,305,003 | 4/1994 | Han | 341/120 |
| 5,341,135 | 8/1994 | Pearce | 341/120 |
| 5,361,067 | 11/1994 | Pinckley | 341/120 |
| 5,594,612 | 1/1997 | Henrion | 341/120 |

*Primary Examiner*—Jeffrey A. Gaffin
*Assistant Examiner*—Jason L. W. Kost
*Attorney, Agent, or Firm*—Fleshner & Kim

[57] ABSTRACT

A conversion characteristic test circuit and method for an A/D converter uses a DNL error, an INL error, and a dynamic conversion characteristic to analyze digital data output from an A/D converter for judging an operation state of the A/D converter. The conversion characteristic test circuit includes a data detecting unit that detects a digital code randomly output from the A/D converter. A test signal generating unit generates a sequential test signal in accordance with a test clock signal. A DNL error data detecting unit receives a data output by the data detecting unit in accordance with the sequential test signal and subtracts the data from an code-by ideal data to compute DNL error data. An INL error data detecting unit computes INL error data based on the DNL error data and the test clock signal. A judging unit receives the outputs of the DNL error data detecting unit and the INL error data detecting unit and detects a DNL error and an INL error to judge an operation state of the A/D converter.

21 Claims, 8 Drawing Sheets

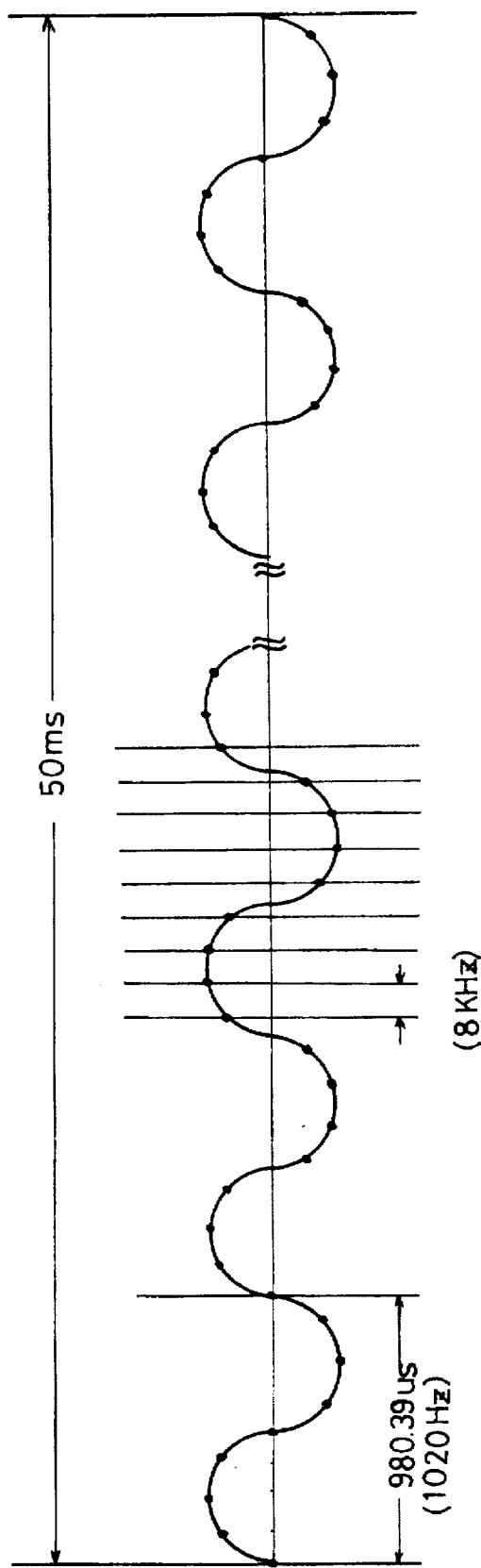

FIG. 6

| ADC OUTPUT CODE | RANGE OF INPUT VOLTAGE | RANGE OF SINE WAVE | | PERCENTAGE (%) | THE NUMBER OF SAMPLING |
|---|---|---|---|---|---|
| 1111 | $\frac{1.813 FSR}{2}$ ~ FSR | 54.40° ~ 125.60° | | 20 | 80 |
| 1110 | $\frac{1.688 FSR}{2}$ ~ $\frac{1.813 FSR}{2}$ | 43.48°~54.39° | 125.61°~136.52° | 6 | 24 |
| 1101 | $\frac{1.563 FSR}{2}$ ~ $\frac{1.688 FSR}{2}$ | 34.27°~43.47° | 136.53°~145.73° | 5 | 20 |
| 1100 | $\frac{1.438 FSR}{2}$ ~ $\frac{1.563 FSR}{2}$ | 25.99°~34.26° | 145.74°~154.01° | 5 | 20 |
| 1011 | $\frac{1.313 FSR}{2}$ ~ $\frac{1.438 FSR}{2}$ | 18.25°~25.98° | 154.02°~161.75° | 4 | 16 |
| 1010 | $\frac{1.188 FSR}{2}$ ~ $\frac{1.313 FSR}{2}$ | 10.85°~18.24° | 161.76°~169.15° | 4 | 16 |
| 1001 | $\frac{1.063 FSR}{2}$ ~ $\frac{1.188 FSR}{2}$ | 3.62°~1.84° | 169.16°~176.38° | 4 | 16 |
| 1000 | $\frac{0.937 FSR}{2}$ ~ $\frac{1.063 FSR}{2}$ | 356.39°~3.61° | 176.39°~183.61° | 4 | 16 |
| 0111 | $\frac{0.812 FSR}{2}$ ~ $\frac{0.937 FSR}{2}$ | 349.16°~356.38° | 183.62°~190.84° | 4 | 16 |
| 0110 | $\frac{0.687 FSR}{2}$ ~ $\frac{0.812 FSR}{2}$ | 341.16°~349.15° | 190.85°~198.24° | 4 | 16 |
| 0101 | $\frac{0.562 FSR}{2}$ ~ $\frac{0.687 FSR}{2}$ | 334.02°~341.75° | 198.25°~205.98° | 4 | 16 |
| 0100 | $\frac{0.437 FSR}{2}$ ~ $\frac{0.562 FSR}{2}$ | 325.74°~334.02° | 205.99°~214.24° | 5 | 20 |
| 0011 | $\frac{0.312 RSR}{2}$ ~ $\frac{0.437 FSR}{2}$ | 316.53°~325.73° | 214.27°~223.47° | 5 | 20 |
| 0010 | $\frac{0.187 FSR}{2}$ ~ $\frac{0.312 RSR}{2}$ | 305.61°~316.52° | 223.48°~234.39° | 6 | 24 |
| 0001 | $\frac{0.062 FSR}{2}$ ~ $\frac{0.187 FSR}{2}$ | 290.28°~305.60° | 234.40°~249.72° | 9 | 36 |
| 0000 | 0 ~ $\frac{0.062 FSR}{2}$ | 249.73° ~ 290.27° | | 11 | 44 |

INPUT VOLTAGE = $(SIN\theta \cdot \frac{FSR}{2} + VOFFSET)$ $= \frac{FSR}{2}(SIN\theta + 1)$ VOFFSET = $\frac{FSR}{2}$

FSR(FULL SCALE RANGE)
: RANGE OF ANALOG INPUT VOLTAGE

FIG. 7

| TEST SIGNAL | OUTPUT OF SECOND MEMORY | OUTPUT OF FIRST MEMORY | OUTPUT OF SUBTRATOR | DNL ERROR DATA | INL ERROR DATA (OUTPUT OF SECOND ADDER) |
|---|---|---|---|---|---|
| 0000 | 44 | 45 | | | |
| 0001 | 36 | 35 | + 1 | 1 | + 1 |
| 0010 | 24 | 30 | − 6 | 6 | − 5 |
| 0011 | 20 | 28 | − 8 | 8 | − 13 |
| 0100 | 20 | 27 | − 7 | 7 | − 20 |
| 0101 | 16 | 25 | − 9 | 9 | − 29 |
| 0110 | 16 | 20 | − 4 | 4 | − 33 |
| 0111 | 16 | 16 | 0 | 0 | − 33 |
| 1000 | 16 | 15 | + 1 | 1 | − 32 |
| 1001 | 16 | 10 | + 6 | 6 | − 26 |
| 1010 | 16 | 10 | + 6 | 6 | − 20 |
| 1011 | 16 | 10 | + 6 | 6 | − 14 |
| 1100 | 20 | 10 | + 10 | 10 | − 4 |
| 1101 | 20 | 15 | + 5 | 5 | + 1 |
| 1110 | 24 | 20 | + 4 | 4 | + 5 |
| 1111 | 80 | 84 | | | |

5,712,633

CONVERSION CHARACTERISTIC TEST CIRCUIT FOR ANALOG/DIGITAL CONVERTER AND METHOD THEREOF

BACKGROUND OF THE INVENTION

1. Field of the Invention

The present invention relates to a conversion characteristic test circuit for an analog/digital (A/D) converter and a method thereof, and particularly to an improved conversion characteristic test circuit for an A/D converter and a method thereof capable of testing a differential non-linearity (DNL) error, an integral non-linearity (INL) error, and a dynamic conversion characteristic by hardware-processing an analog signal having a sine wave form and analyzing a digital data outputted from an A/D converter.

2. Description of the Conventional Art

FIG. 1 shows a conversion characteristic test circuit of a conventional analog/digital converter (ADC), which includes a ramp signal generating unit 10 for generating a sequential ramp in accordance with a control signal outputted from a chip 70, an ADC 20 for receiving a ramp voltage from the ramp signal generating unit 10 and for converting an analog signal code into a digital signal code in accordance with a clock signal CLK outputted from a clock generating unit (not shown) of the chip 70, and a conversion characteristic testing unit 30 for receiving a digital signal code from the ADC, analyzing the digital signal code in accordance with a clock signal CLK and a test control signal, and testing a conversion characteristic of the ADC 20.

The conversion characteristic testing unit 30 includes a first resister 31 for storing a digital code outputted from the ADC 20 in accordance with a clock signal CLK and for outputting a digital signal code stored therein in accordance with a test control signal outputted from an externally connected element, a second register 32 for storing a digital signal code stored in the first register 31 in accordance with a clock signal CLK before the output digital signal code of the ADC 20 is stored in the first register 31 and for outputting a digital code in accordance with a test control signal outputted from an externally connected element, a comparing unit 33 for comparing the digital signal code outputted from the first register 31 and the digital signal code outputted from the second register 32 in accordance with a test control signal, and a control logic unit 34 for receiving an output of the comparing unit 33 in accordance with a test control signal and for judging if the ADC 20 normally operates.

The operation of a conversion characteristic test circuit for a conventional ADC will now be explained with reference to the accompanying drawings.

To begin with, when a control signal is inputted thereto from the outside of the chip 70, the ramp signal generating unit 10 generates a ramp voltage having a range of the highest level through the lowest level and outputs the ramp voltage to the ADC 20. The ADC 20 receives the ramp voltage sequentially outputted from the ramp signal generating unit 10 and sequentially converts the ramp voltage into a digital signal code having the lowest alignment "00 . . . 0" and the lowest alignment "11 . . . 1" in accordance with a clock signal applied thereto.

Thereafter, the first register 31 stores the digital signal code outputted from the ADC in accordance with a clock signal CLK, and the second register 32 stores the digital signal code stored in the first register 31 in accordance with a clock signal CLK applied thereto before the digital signal code outputted from the ADC 20 is stored in the first register 31.

When a test control signal is inputted thereto from an externally connected element, the first register 31 and the second register 32 output the stored data to the comparing unit 33 in accordance with a test control signal, and the comparing unit 33 compares the output data outputted from the first register 31 and the second register 32 in accordance with a test control signal.

Since the ADC 20 receives a ramp voltage from the ramp signal generating unit 10 and converts into a digital signal code having the lowest code "00 . . . 0" and the highest signal code "11 . . . 1", a certain signal code increased by "+1" rather than the most previous digital signal code, except that the digital signal code becomes "−1" due to a conversion noise, is outputted.

Therefore, the comparing unit 33 compares the output data of the first register 31 and the output data of the second register 32 in accordance with a test control signal and outputs a signal of 0, 1, −1 or ±2 to the control logic unit 34, and the control logic unit 34 receives the output of the comparing unit 33 and outputs a pass signal by judging that the ADC 20 normally works when the input is "0, 1, or −1", and the control logic unit 34 outputs a fail signal by judging an A/D conversion is abnormally performed by the ADC 20 when a certain signal having over ±2 is inputted thereto.

However, since the conversion characteristic test circuit for a conventional ADC simply tests a conversion characteristic of an ADC by checking whether the output of the ADC is increased by "+1", when a dynamic analog signal having a sine wave form is inputted to the ADC and is periodically sampled thereby, digital signals are randomly outputted therefrom. That is, the digital signals are not increased by "+1", so that it is difficult to more accurately test a conversion characteristic of an ADC.

In addition, the purchase of related equipments is costly, and since software plays a key role in a test circuit, the speed of the operation is relatively slow, and the method of testing is complicated, so that it takes long time to test the conversion characteristic of an ADC.

SUMMARY OF THE INVENTION

Accordingly, it is an object of the present invention to provide a conversion characteristic test circuit for an A/D converter and a method thereof, which overcome the problems encountered in a conventional conversion characteristic test circuit for an A/D converter and a method thereof.

It is another object of the present invention to provide an improved conversion characteristic test circuit for an A/D converter and a method thereof capable of testing a DNL error, an INL error, and a dynamic conversion characteristic by hardware-processing an analog signal having a sine wave form and analyzing a digital data outputted from an A/D converter.

To achieve the above objects, there is provided a conversion characteristic test circuit for an A/D converter, which includes a data detecting unit for detecting a digital code randomly outputted from an analog/digital converter; a test signal generating unit for generating a sequential test signal outputted from an externally connected element in accordance with a test clock signal; a DNL error data detecting unit for receiving a data outputted from the data detecting unit in accordance with a test signal and for subtracting the data from an ideal code-by data stored therein and for computing a DNL error data; an INL error data detecting unit for accumulatively adding the output of the DNL error data detecting unit in accordance with a test clock signal and for computing an INL error data; and an operation judging unit for receiving the outputs of the DNL error data detecting unit and the INL error data detecting unit and for detecting a DNL error and an INL error and for judging an operation state of the analog/digital converter in accordance with a test clock signal.

To achieve the above objects, there is provided a conversion characteristic test method for an A/D converter, which includes the steps of: a first step which detects a plurality of digital codes when a sine wave form outputted from an analog/digital converter is sampled at a frequency interval of a clock signal for a predetermined cycle and is outputted in a form of a plurality of digital codes; a second step which subtracts a data of the thusly detected digital code and a data of a digital code inputted thereto when the analog/digital converter normally operates and computes a DNL error data; a third step which accumulatively adds a DNL error data outputted from the second step and computes an INL error data; and a fourth step which compares a DNL error data outputted from the second step and an INL error data outputted from the third step with the maximum/minimum values of the DNL specification and the INL specification, respectively and computes a DNL error and an INL error, and judges a conversion characteristic of the analog/digital converter.

BRIEF DESCRIPTION OF THE DRAWINGS

FIG. 5 is a view of a sampling data of an ADC according to the present invention.

FIG. 6 is a table of a data output of an ADC when a sine wave is applied thereto according to the present invention.

FIG. 7 is a table of a comparison between an ideal conversion data and an error data of an ADC of FIG. 2 according to the present invention.

DETAILED DESCRIPTION OF THE INVENTION

Figure 1:
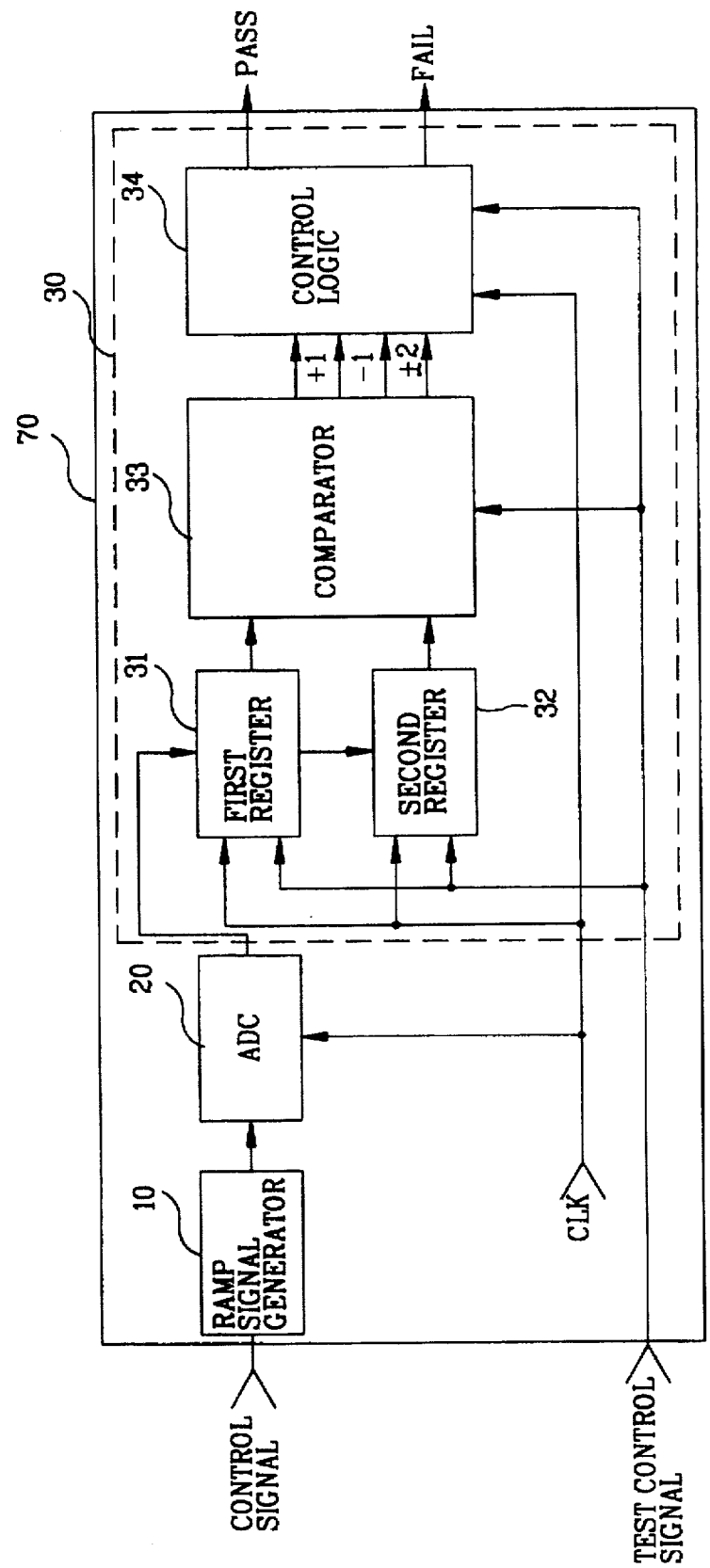
FIG. 1 is a block diagram of a conversion characteristic test circuit of a conventional analog/digital converter (ADC).
Figure 2:
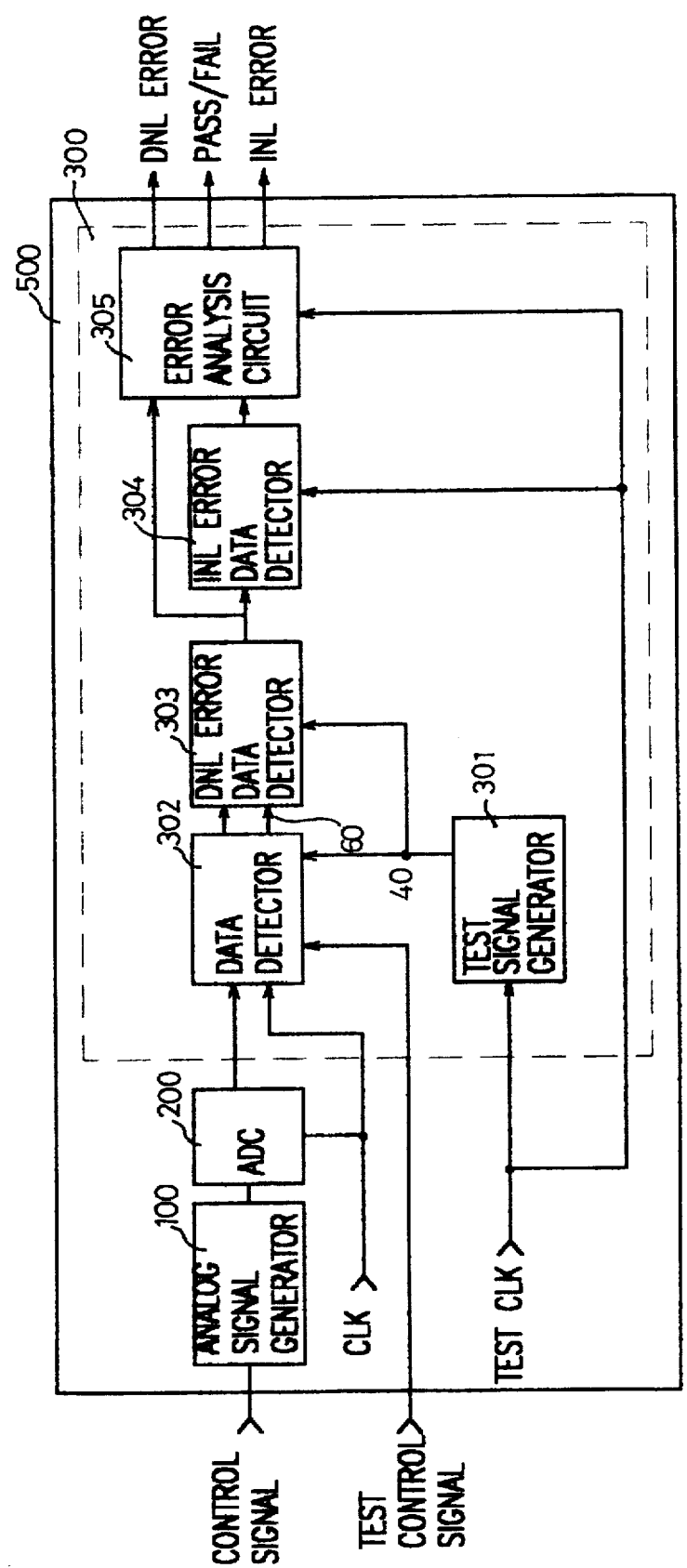
FIG. 2 is a block diagram of a conversion characteristic test circuit of an ADC according to the present invention.

FIG. 2 shows a conversion characteristic test circuit for an ADC according to the present invention, which includes an analog signal generating unit 100 for generating an analog signal having a sine wave form in accordance with a control signal outputted from a chip 500, an "n" bit ADC 200 for sampling a signal of a sine wave form outputted from the analog signal generating unit 100 and for outputting a random digital signal code in accordance with a clock signal CLK outputted from a clock generating unit (not shown) of the chip 500, and an output testing unit 300 detecting a random digital sinal code outputted from the ADC 200 and for testing a DNL error, an INL error, and a dynamic conversion characteristic of an ADC 200 in accordance with a test control signal, a clock signal CLK, and a test clock signal outputted from externally connected elements.

The output testing unit 300 includes a test signal generating unit 301 consisting of "n" bit counters for generating a test signal 40 in accordance with a test clock signal applied thereto from an externally connected element, a data detecting unit 302 for receiving a clock signal and a test control signal, which are applied thereto from externally connected elements and a test signal 40, detecting a random digital code outputted from the ADC 200, and detecting a code-by data 50, a DNL error data detecting unit 303 for receiving a code-by data 50 from the data detecting unit 302 and a test signal 40 from the test signal generating unit 301, comparing the signals with a code-by ideal data of the ADC 200, and computing a DNL error data, an INL error data detecting unit 304 for receiving an output of the DNL error data detecting unit 303, accumulatively adding the outputs in accordance with a test clock signal, computing an INL error data, and a operation analyzing unit 305 for receiving outputs of the DNL error data detecting unit 303 and the INL error data detecting unit 304, detecting a DNL error and an INL error in accordance with a test clock signal, and judging an operation state of the ADC 200 using the thusly detected errors.

The data detecting unit 302 includes a multiplexer 312 for selectively outputting a test signal 40 outputted from an "A" terminal and a digital signal code outputted from a "B" terminal in accordance with a test control signal, a first memory 313 for outputting an addressed data in accordance with an output of the multiplexer 312 for half a cycle of a clock signal CLK outputted from an externally connected element and for storing a data which is increased by "+1" for the remaining half of the cycle of the clock signal CLK, a first adder for receiving the output of the first memory 313 through an "A" terminal and for receiving a "D1" of a high level of "m" least significant bit (LSB) and for receiving "m−1" input from a "B" terminal and for increasing the output of the first memory by "+1", a first flip-flop 315 for receiving the output of the adder 314 and for feeding back the output of the adder 314 to the output of the first memory 313 in accordance with a clock signal CLK outputted from an invertor IN1 controlled in accordance with a test control signal, and a data transmitting unit 316 for outputting the data of the first memory in accordance with a test control signal 60 outputted from an invertor IN2.

The DNL error data detecting unit 303 includes a second memory 317 enabled in accordance with an inverted test control signal 60 for storing a digital signal code data outputted from the ADC 200, when it normally works, and for outputting a digital signal code ideal data stored in an address designated by the test signal in accordance with a sequential test signal 40, and a subtractor 318 for receiving the output of the second memory 317 and the output 50 of the data transmitting unit and for detecting a DNL error data by subtracting the code ideal data of the ADC 200 and the code data which is really detected.

The INL error data detecting unit 304 includes a second adder 320 for receiving the DNL error data from the adder 318 and for accumulatively adding the data, and a second flip-flop 321 for receiving the output of the second adder 320 in accordance with a test clock signal outputted from an externally connected element and for feeding back the thusly received output to the second adder 320.

The operation analyzing unit 305 includes a first comparing unit 319 for receiving the output of the subtracting unit 318 and for comparing the maximum value with the minimum value of the DNL specification, a third flip-flop 323 for receiving the output of the first comparing unit 319 and for outputting a DNL error, a second comparing unit 322 for receiving the output of the second flip-flop 321 and for comparing the maximum value with the minimum value of the INL specification, a fourth flip-flop 324 for receiving the output of the second comparing unit 322 and for outputting an INL error, an OR-gate 325 for ORing the output of the third flip-flop 323 and the output of the fourth flip-flop 324, a dividing unit 326 for outputting a divided signal in accordance with a test clock signal outputted from an externally connected element, and a fifth flip-flop 327 for judging an operation state of the ADC 200 with respect to the output of the OR-gate 325 in accordance with an output signal of the dividing unit 326.

The first comparing unit 319 includes a first comparing unit 350 for receiving the output of the subtracting unit 318 through the "A" terminal and for comparing the thusly received output with the maximum value received from the "B" terminal, a second comparing unit 351 for receiving the output of the subtracting unit 319 through the terminal and for comparing the thusly received output with the minimum value received through the "A" terminal, and an OR-gate 352 for exclusively ORing the outputs of the first comparing unit 350 and the second comparing unit 351.

The second comparing unit 322 includes a third comparing unit 353 for receiving the output of the second adder 320 through the "A" terminal and for comparing the thusly received output with the maximum value received through the "B" terminal, a fourth comparing unit 354 for receiving the output of the second adder 320 through the terminal and for comparing the thusly received output with the minimum value of the INL specification through the "A" terminal, and an OR-gate 355 for ORing the outputs of the third comparing unit 353 and the fourth comparing unit 354.

The operation of the conversion characteristic test circuit for an ADC will now be explained with reference to FIGS. 3 through 7.

To begin with, the ADC 200 is set as 4 bits, and the DNL and INL specifications are set as ±0.5LSB, respectively, and the clock frequency of the A/D converter is set as 8 khz, and the test clock of the operation of the test mode is set as 10 khz.

Thereafter, as shown in FIG. 2, when a control signal is inputted from the outside of the chip 500, the analog signal generating unit 100 generates a sine wave form of 1 khz and outputs to the ADC 200 having 4 bits, and the ADC 200 samples the sine wave form in accordance with a clock frequency of 8 mhz outputted from the clock generating unit (not shown) of the chip 500.

At this time, the relationship between the test frequency outputted from the ADC 200 having 4 bits and the sampling frequency (clock frequency) can be expressed as follows:

$$\frac{ft}{fs} = \frac{M}{N} \qquad \text{formula (1)}$$

where ft denotes a test frequency, and fs denotes a sampling frequency, M denotes the number of cycles of sine wave form, and N denotes the number of sampling.

Therefore, when a sine wave form of 1 khz is inputted as a test frequency to the ADC 200, and a clock frequency of 8 khz is inputted as a sampling frequency to the ADC 200, when sampling for a certain cycle, the sampling data of the number of integer can be expressed as follows by the formula 1.

$$\frac{ft(1020\ hz)}{fs(8000\ hz)} = \frac{M(51)}{N(400)} \qquad \text{formula (2)}$$

That is, the ADC 200 outputs 400 digital codes to the output testing unit 300 by converting 400 digital codes into 4 bits of 16 codes by taking 400 sampling points for 51 cycles (50 mS) based on a sampling point with a sampling point per clock frequency of 8 Khz (125 μs) of 1020 hz (980.391 μs). Here, 50 m corresponds to 980.39 μs×51 cycles, 125 μs×400 sampling.

Figure 3:
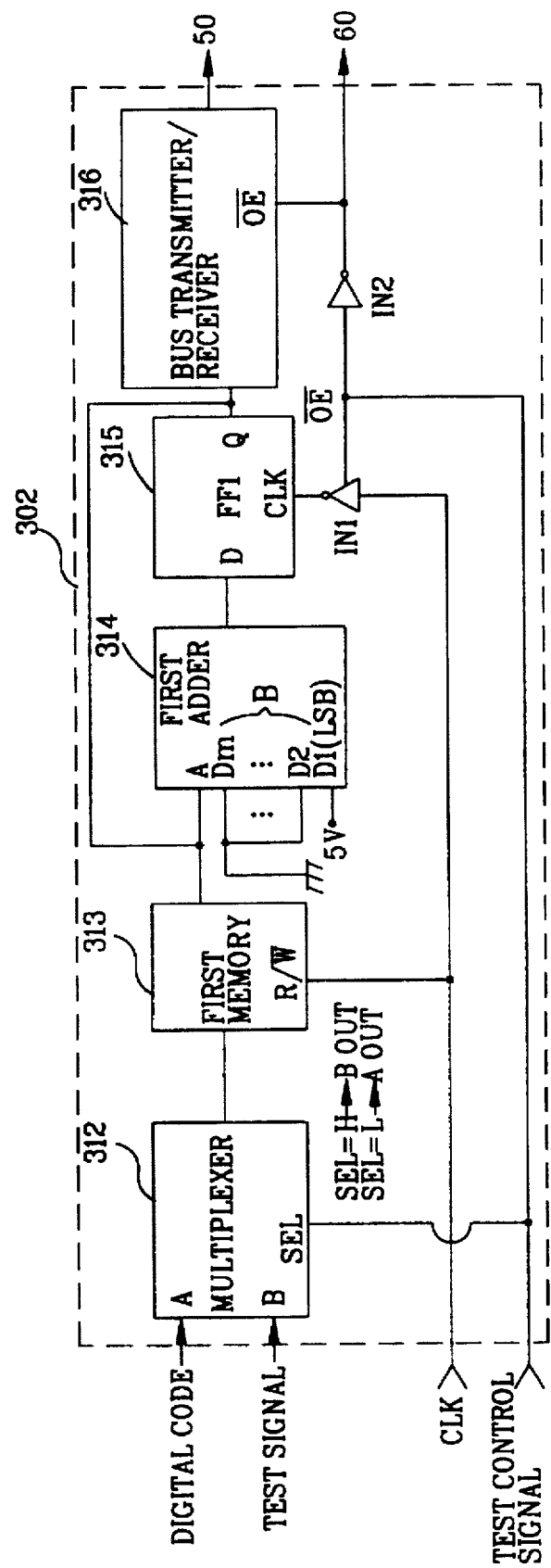
FIG. 3 is a block diagram of a data detecting unit of FIG. 2 according to the present invention.

Thereafter, when a test control signal of a low level is inputted to the data detecting unit 302 of the output testing unit 300 from the outside element of the chip 500 so as to receive 400 digital codes outputted from the ADC 200, the test control signal, as shown in FIG. 3, is inputted to an output enable terminal OE of the data transmitting unit 316 through the selecting terminal SELECT of the multiplexer 312 and the inverter IN1, and a clock signal is inputted to the first flip-flop 315 through a read/write terminal R/W of the first memory 313 and the invertor IN1.

Therefore, the multiplexer 312 of the data detecting unit 302, as shown in FIG. 3, outputs the digital codes "0000~1111" which is inputted to the "A" terminal, to the address input terminal of the first memory 313 in accordance with a test control signal of a low level inputted to the selection terminal SELECT, and the first memory 313 becomes a read mode for first half of one cycle of the clock signal, and outputs a data of the address addressed by a digital code to the "A" terminal of the first adder 314 by receiving 4 bits and 16 codes of "0000~1111" outputted from the multiplexer 312, and the first memory 313 becomes a write mode for the remaining half of the cycle of a clock signal writes the data increased by +1 and outputted from the first adder 314 through the flip-flop 315 on the addressed address.

As described above, whenever the data of 4 bits of "0000~1111" is addressed to the first memory 313, the data is stored in the first memory 313, and when checking a data value of a certain address, it can be known that how many an address is addressed.

At this time, the data transmitting unit 316 is disabled in accordance with a test control signal 60 outputted from the invertor IN2 and does not output the data outputted from the first flip-flop 315.

In addition, FIG. 3 shows an output data distribution of the ADC 200 when a sine wave forms is inputted thereto. When the ADC 200 normally operates, the digital code "1111" is outputted 80 times, and "1110 and 0010" are outputted 24 times respectively, and "1101, 1100, 0100, and 0011" are outputted 20 times, respectively, and "1011, 1010, 1001, 1000, 0111, 0110, and 0101" are outputted 16 times, respectively, and "0001" is outputted 36 times, and "0000" is outputted 44 times.

Therefore, the data 44 is stored in the address "0000" of the first memory 313, and the data 36 is stored in the address "0001", and the data 24 is stored in the address "0010", and the data 20 is stored in the addresses "0011 and 0100", respectively, and the data 16 is stored in the addresses "0101, 0110, 0111, 1000, 1001, 1010, and 1011" respectively, and the data 20 is stored in the addresses "1100 and 1101", respectively, and the data 24 is stored in the address "1110", and the data 80 is addressed in the address "1111".

However, in case that the analog/digital conversion is not performed, a certain error data, that is, it does not correspond to the above-mentioned number, is outputted from the ADC 200 and stored in the first memory 313.

The conversion characteristic test method of the ADC when the A/D conversion does not performed in the ADC 200 will now be explained.

To begin with, of the error data outputted from the ADC 200, the data 45 is stored in an address of "0000", and the data 35 is stored in an address of "0001", and the data 30 is stored in an address of "00010", and the data 28 is stored in an address of "0011", and the data 27 is stored in an address of "0100", and the data 25 is stored in an address of "0101", and the data 20 is stored in an address of 0110, and the data 16 is stored in an address of "0111", and the data 15 is stored in an address of "1000", and the data 10 is stored in addresses "1001, 1010, 1011 and 1100" respectively, and the data 15 is stored in an addresses of "1101", and the data 20 is stored in an address of "1110", and the data 84 is stored in an address of "1111."

Thereafter, when a test control signal of a high level is inputted so as to test a conversion characteristic of the ADC 200 and a test clock signal of 10 khz is inputted, the test clock signal is inputted to the test signal generating unit 301, the INL error data detecting unit 304, and the error analyzing unit 305, respectively.

The "n" bit counter of the test signal generating unit 301 counts the test clock signal inputted thereto and outputs the sequential test signal 40 of "0000˜1111" to the data detecting unit 302.

Figure 4:
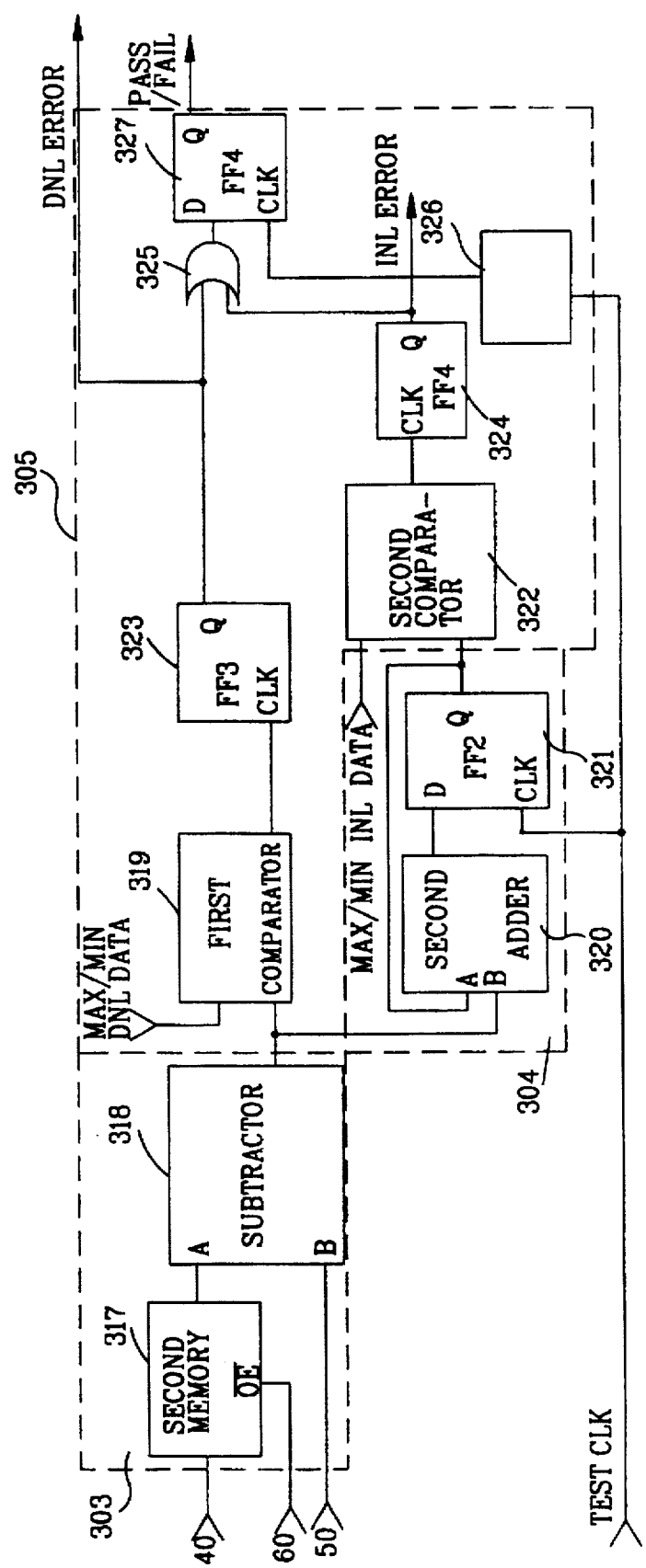
FIG. 4 is a block diagram of a DNL error data detecting unit, an INL error data detecting unit, and an error analyzing unit of FIG. 2 according to the present invention.

Thereafter, the test signal 40 outputted from the test signal generating unit 301 is inputted to the "B" terminal of the multiplexer 312, and the first flip-flop 315 is not operational in accordance with a test control signal of a high level, and the test control signal 60 of a low level inverted by the invertor IN2 is inputted to an output enable terminal OE of the data transmission unit 316 and an output enable terminal OE of the second memory 317, respectively, as shown in FIG. 4. At this time, the clock signal CLK maintains a high level.

Therefore, the multiplexer 312 of the data detecting unit 302 outputs a sequential test signal 40 of "0000˜1111" inputted to the "B" terminal in accordance with a test control signal of a high level to the first memory 313, and the first memory 313 becomes a READ mode in accordance with a clock signal of a high level and receives a sequential test signal 40 of "0000˜1111" outputted from the multiplexer 312 and transmits the error data previously stored in a corresponding address in accordance with a test signal 40 through the data transmitting unit 316.

In addition, the second memory 317 of the DNL error data detecting unit 303 is enabled in accordance with the control signal 60, and receives the sequential test signal 40 of "0000˜1111", and outputs an ideal data previously stored in a corresponding address which is addressed in accordance with the test signal 40 to the "A" terminal of the subtracting unit 318, and the error data 50 of the first memory transmitted through the data transmitting unit 316 is inputted to the "B" terminal of the subtracting unit 318 of the DNL error data detecting unit 303.

Therefore, the subtracting unit 318 computes the difference between a code-by ideal data of the ADC 200 inputted thereto through the "A" terminal and the error data 50 inputted thereto through the "B" terminal and outputs the difference to the first comparing unit 319 of the error analyzing unit 305 and the second adder 320 of the INL error detecting unit 304, respectively.

At this time, since the address of "0000" and the data of "1111" are corresponds to an off-set of the ADC 200 and a gain error, respectively, these are not considered in the above-mentioned computation.

In addition, the second adder 320 adds the output of the subtracting unit 318 inputted thereto through the "B" terminal, and outputs to the second flip-flop 321, and the second flip-flop 321 outputs the output of the second adder 320 inputted thereto to the "A" terminal of the second adder 320 and the second comparing unit 322 of the error analyzing unit 305 in accordance with a test clock signal.

The second adder is directed to accumulatively adding the output of the subtracting unit 318 and the output of the second flip-flop 321 feeding back to the "A" terminal and outputting to the second comparing unit 322 in order through the second flip-flop 321.

FIG. 7 show the data value outputted from the first memory 313 and the second memory 317 in accordance with a sequential test signal 40 and the output value of the subtracting unit 318 and the adder 320 with respect thereto.

The error analyzing unit 305 receives the output of the subtracting unit 318 and the output of the second adder 320 and analyzes the conversion characteristic of the ADC 200, and the first comparing unit 319 receives the output of the subtracting unit 318 and compares the output of the subtracting unit 318 with the maximum/minimum value of the DNL specification, and the second comparing unit 322 compares the output of the second adder with the maximum/minimum INL specification of the INL specification.

Figure 8A:
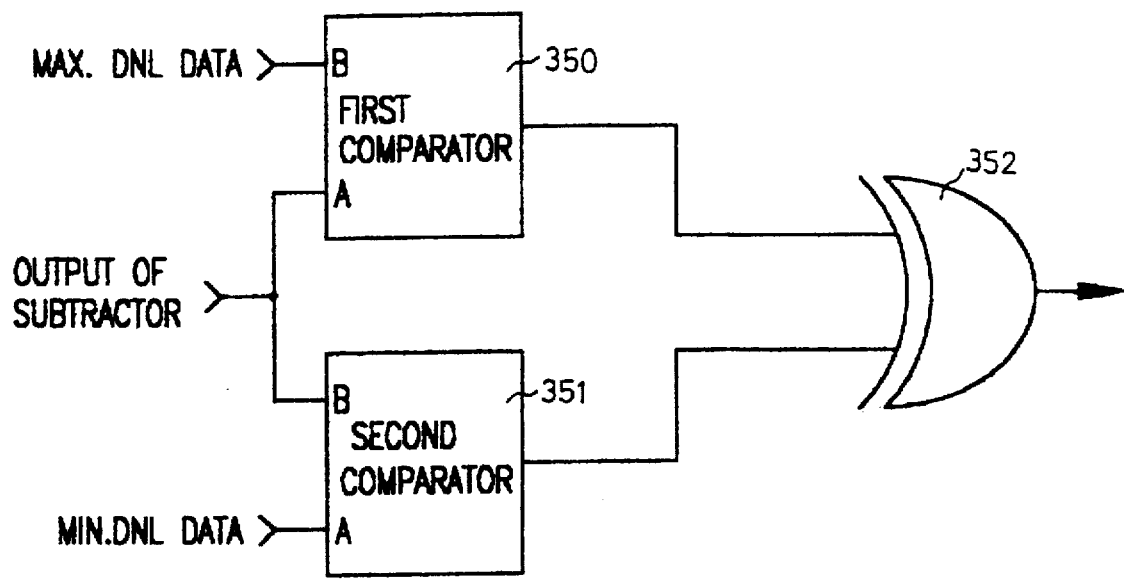
FIG. 8A is a block diagram of a first comparing unit of FIG. 4 according to the present invention.

The first comparing unit 319 receives the output of |(A)-(B)| of the subtracting unit 318 as shown in FIG. 8A through the "A" terminal of the first comparing unit 350 and the "B" terminal of the second comparing unit 351, and the maximum value +0.5LSB of the DNL specification is received through the "B" terminal of the first comparing unit 350, and the minimum DNL specification −0.5LSB is received through the "B" terminal of the second comparing unit 351.

In addition, the outputs of the first comparing unit 350 and the second comparing unit 351 can be expressed as follows:

A>B→output:H              formula (3)

A<B→output:L              formula (4)

Therefore, the first comparing unit 350 and the second comparing unit 351 compare the output of the subtracting unit 318 inputted thereto in accordance with the above-mentioned two expressions with the maximum/minimum values of the DNL specification, and the exclusive OR-gate X-OR 352 exclusively ORs the output signal of the first comparing unit 350 and the second comparing unit 351.

At this time, when the output of the subtracting unit 319 exists between the maximum value of +0.5 and the minimum value of −0.5 of the DNL specification, a low level signal is outputted, and the output thereof does not exist within the above-mentioned range, a high level signal is outputted. Therefore, when there is an address signal of a high level outputted from the first comparing unit 319, it means that the ADC 200 has a DNL error corresponding to the address when converting into a digital code.

In addition, when a high level signal is outputted from the first comparing unit, that is, when a DNL error occurs, the input terminal "D" of the third flip-flop 323 is set a high level, and the third flip-flop 323 outputs a high level signal to the input terminal of the OR-gate 325, and output of the third flip-flop 323 corresponds to an INL error signal.

Figure 8B:
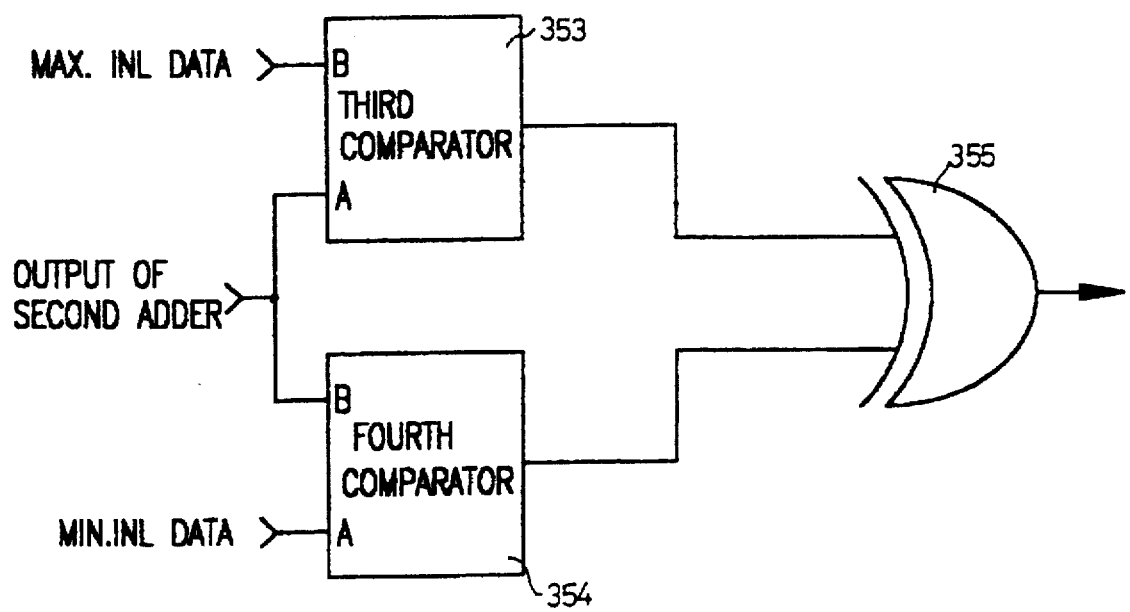
FIG. 8B is a block diagram of a second comparing unit of FIG. 4 according to the present invention.

The second comparing unit 322, as shown in FIG. 8B, receives the output of the second adder 320, which is inputted through the second flip-flop 321, through the "A" terminal of the third comparing unit 353 and the "B"

terminal of the fourth comparing unit 354, respectively, and the maximum value +0.5LSB of the INL specification is inputted through the "B" terminal of the third comparing unit 353, and the minimum value −0.5LSB of the INL specification is received through the "A" input terminal of the fourth comparing unit 354.

Therefore, the third comparing unit 353 and the fourth comparing unit 354 of the second comparing unit 322 compare the output sequentially inputted thereto through the second flip-flop 321 based on the formulas (3) and (4) with the maximum/minimum values of the INL specification, and the exclusive OR-gate X-OR 355 exclusively ORs the output signals of the third comparing unit 353 and the fourth comparing unit 354.

In addition, when a high level signal is outputted from the second comparing unit 322 once more, that is, an INL error occurs, the input terminal "D" of the fourth flip-flop 324 is set as a high level, and the fourth flip-flop 324 outputs a high level signal to the input terminal of the OR-gate 325, and the output of the fourth flip-flop 324 corresponds to the INL error signal.

Thereafter, the OR-gate 325 ORs the outputs of the third flip-flop 323 and the fourth flip-flop 324 and outputs to the input terminal of the fifth flip-flop 327, and the dividing unit 326 divides a test clock signal inputted thereto into 16 clock signals and outputs to the clock terminal of the fifth flip-flop 327, and when the outputs of 16 clock signals is completed, and the thusly divided clock signals are outputted to the clock terminal of the fifth flip-flop 327.

Therefore, as a completion signal is inputted, the fifth flip-flop 327 outputs a signal of a high level indicating that the conversion characteristic test of the ADC 200 is abnormally executed, that is, "fail," when the input terminal "D" is set as a high level.

Meanwhile, when a completion signal is inputted from the dividing unit 326, the fifth flip-flop 327 outputs a signal of a low level indicating that a conversion characteristic test is normally executed, that is, "pass," when the input terminal "D" is set as a low level.

As described above, the conversion characteristic test circuit for an analog/digital converter and a method thereof according to the present invention is directed to more easily testing an ADC conversion characteristic at a lower cost, and more accurately testing a DNL error and an INL error in accordance with an A/D conversion, and reducing the test speed in cooperation with a high speed signal processing by hardware-processing the signal flow, analyzing the digital codes, and testing a dynamic conversion characteristic of the ADC when an analog signal having a sine wave form is inputted to the ADC and outputted in a random digital code form.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A conversion characteristic test circuit for an analog/digital converter, comprising:
    a data detecting unit for detecting a digital code randomly outputted from an analog/digital converter;
    a test signal generating unit for generating a sequential test signal in accordance with a test clock signal;
    a DNL error data detecting unit for receiving a data output from said data detecting unit based on said sequential test signal, for subtracting the data from a code-by ideal data stored in the DNL error data detecting unit and for computing a DNL error data;
    an INL error data detecting unit for accumulatively adding the output of said DNL error data detecting unit in accordance with said test clock signal and for computing an INL error data; and
    an operation judging unit for receiving the outputs of the DNL error data detecting unit and said INL error data detecting unit wherein said operation judging unit detects a DNL error and an INL error, and judges an operation of said analog/digital converter in accordance with said test clock signal.

2. The circuit of claim 1, wherein said data detecting unit includes:
    a multiplexer for outputting an output of an "A" terminal and output of a "B" terminal in accordance with a test control signal;
    a first memory for outputting a stored data and a feeding back data in accordance with a clock signal;
    a first adder for adding the data outputted from said first memory by +1;
    a first flip-flop for receiving the output of said first adder and for feeding back said feeding back data to the first memory output in accordance with said clock signal outputted through an invertor; and
    a data transmitting unit enabled in accordance with said test control signal outputted from another invertor for transmitting the data of the first memory.

3. The circuit of claim 2, wherein said multiplexer is directed to outputting a data input through said "B" terminal when said test control signal is a high level, and outputting a data input through said "A" terminal when said test control signal is a low level.

4. The circuit of claim 3, wherein said "A" terminal receives a digital code outputted from the analog/digital converter, and said "B" terminal receives a test signal.

5. The circuit of claim 2, wherein said first memory is directed to outputting an addressed output by the multiplexer for half the first cycle of said clock signal when said clock signal is a high level, and storing said feeding back data for the remaining half of the first cycle of said clock signal.

6. The circuit of claim 3, wherein said first adder includes an "A" terminal for receiving said output of the first memory and a "B" terminal of which a LSB input of "m" inputs receives a high level signal and "m−1" inputs are connected to the ground.

7. The circuit of claim 1, wherein said operation judging unit includes:
    a first comparing unit for receiving said DNL error data and for comparing the maximum value with the minimum value of a DNL specification;
    a third flip-flop for receiving an output of said first comparing unit and for outputting a DNL error;
    a second comparing unit for receiving said INL error data and for comparing the maximum value with the minimum value of an INL specification;
    a fourth flip-flop for receiving an output of said comparing unit and for outputting an INL error;
    an OR-gate for ORing an output of said third flip-flop and an output of said fourth flip-flop;
    a dividing unit for dividing said test clock signal; and
    a fifth flip-flop for receiving an output of said OR-gate and for judging an operation state of the analog/digital converter in accordance with a signal outputted from said dividing unit.

8. The circuit of claim 7, wherein said first comparing unit includes:

a third comparing unit for comparing said DNL error data input through an "A" terminal with the maximum value of the DNL specification input through a "B" terminal;

a fourth comparing unit for comparing said DNL error data input through a "B" terminal with the minimum value of the DNL specification inputted through an "A" terminal; and an exclusive OR-gate for exclusively ORing the outputs of said third and fourth comparing units.

9. The circuit of claim 8, wherein said third comparing unit and said fourth comparing unit output a high level signal, respectively, when the data inputted through said "A" terminal is greater than that of the data inputted through said "B" terminal.

10. The circuit of claim 7, wherein said first comparing unit and said second comparing unit respectively output a low level signal when said input DNL and INL error data is within a range of the maximum value and the minimum value of the DNL specification and within a range of the maximum value and the minimum value of the INL specification.

11. The circuit of claim 7, wherein said second comparing unit includes:

a fifth comparing unit for comparing said INL error data inputted through an "A" terminal with the maximum value of the INL specification inputted through a "B" terminal;

a sixth comparing unit for comparing said INL error data inputted through a "B" terminal and the minimum value of the INL specification inputted through an "A" terminal; and an exclusive OR-gate for exclusively ORing the outputs of said fifth comparing unit and said sixth comparing unit.

12. The circuit of claim 1, wherein said test signal generating unit includes an "n" bit counter and outputs $2^n$ test signals sequentially.

13. The circuit of claim 1, wherein said DNL error data detecting unit includes:

a second memory for storing said code-by ideal data outputted when the analog/digital converter normally operates and for outputting said code-by ideal data stored in an address corresponding to said sequential test signal applied thereto based on a test control signal; and a subtracting unit for subtracting said code-by ideal data received from said second memory and actual code-by data of the analog/digital converter received from a data transmitting unit of said data detecting unit.

14. The circuit of claim 1, wherein said INL error data detecting unit includes:

a second adder for accumulatively adding said DNL error data; and a second flip-flop for receiving an output of said second adder and for feeding back said output of said second adder to the second adder in accordance with said test clock signal.

15. A conversion characteristic test method for an analog/digital converter, comprising the steps of:

detecting a plurality of digital codes when a sine wave form outputted from an analog/digital converter is sampled at a frequency interval of a clock signal for a predetermined cycle and outputting said plurality of digital codes;

subtracting a data of said plurality of digital codes and a corresponding data of a digital code determined when said analog/digital converter operates normally to compute a DNL error data;

accumulatively adding said DNL error data from said subtracting step to compute an INL error data; and comparing said DNL error data from said subtracting step and said INL error data from said accumulatively adding step with maximum/minimum values of the DNL specification and the INL specification, respectively, to determine a DNL error, an INL error, and judge a conversion characteristic of the analog/digital converter.

16. The method of claim 15, wherein said detecting step is directed to determining the cycle and the number of sampling so that a certain value obtained by multiplying a frequency of a sine wave inputted thereto when sampling the sine wave by the number of sampling with a certain value obtained by multiplying a basic clock frequency by a cycle of the sine wave are made to be coincident.

17. The method of claim 15, wherein said detecting step is directed to being executed when a test control signal is a low level.

18. The method of claim 15, wherein said subtracting step and said accumulatively adding step are executed when said test control signal is a high level.

19. A conversion characteristic test circuit for an analog/digital (A/D) converter, comprising:

a first error data detecting unit that receives data output from an A/D converter based on a sequential test signal and for subtracting the data from predetermined ideal A/D converter data to compute first error data;

a second error data detecting unit that accumulatively adds said first error data based on a test clock signal to compute second error data; and an operation judging unit that receives said first error data and said second error data to determine a first error and a second error, respectively, wherein the operation judging unit judges an operation state of said A/D converter based on said first error and said second error.

20. The circuit of claim 19, wherein said first error data detecting unit is a DNL error data detecting unit, said first error data is DNL error data and said first error is DNL error, and wherein said second error data detecting unit is an INL error data detecting unit, said second error data is INL error data and said second error is an INL error.

21. The circuit of claim 19, wherein said conversion characteristic test circuit further comprises:

a data detecting unit for detecting a digital code randomly outputted from an analog/digital converter based on a clock signal and a test control signal; and a test signal generating unit for generating said sequential test signal based on said test clock signal.

* * * * *